United States Patent [19]

Pellegrin et al.

[11] Patent Number: 5,287,062

[45] Date of Patent: Feb. 15, 1994

[54] REFERENCE VOLTAGE MEASURING BRIDGE FOR A DEVICE FOR MONITORING AND MEASURING THE INSULATION OF A DC VOLTAGE ELECTRICAL MAINS SYSTEM

[75] Inventors: Christian Pellegrin, Coublevie; Luc Weynachter, Grenoble; Patrice Allin, Meylan, all of France

[73] Assignee: Merlin Gerin, France

[21] Appl. No.: 808,750

[22] Filed: Dec. 17, 1991

[30] Foreign Application Priority Data

Dec. 26, 1990 [FR] France .................................. 90 16404

[51] Int. Cl.⁵ ............................................. G01R 31/02
[52] U.S. Cl. .................................... 324/551; 324/510; 324/544
[58] Field of Search ............... 324/551, 544, 541, 510, 324/520, 522, 526, 557; 323/233, 333, 365

[56] References Cited

U.S. PATENT DOCUMENTS

| | | |
|---|---|---|
| 2,613,345 | 10/1952 | Osterland. |
| 3,189,818 | 6/1965 | Frakes ................. 324/551 |
| 4,896,115 | 1/1990 | LeMaitre et al. ........... 324/551 |

FOREIGN PATENT DOCUMENTS

| | | | |
|---|---|---|---|
| 1308938 | 5/1987 | U.S.S.R. ................. | 324/551 |
| 1451620 | 1/1989 | U.S.S.R. ................. | 324/551 |
| 1499280 | 8/1989 | U.S.S.R. ................. | 324/551 |
| 1597773 | 10/1990 | U.S.S.R. ................. | 324/551 |

OTHER PUBLICATIONS

Journal of Physics E. Scientific Instruments, vol. 10, No. 1, Jan. 1977, Ishing, Bristol GB pp. 71–72.
IEEE Transactions on Instrumentation and Measurement, vol. IM-26, No. 1, Mar. 1977, New York, pp. 46–52.

Primary Examiner—Kenneth A. Wieder
Assistant Examiner—Christopher Tobin
Attorney, Agent, or Firm—Parkhurst, Wendel & Rossi

[57] ABSTRACT

A reference AC signal having a frequency of about 4–10 Hz is injected into a line of a DC electrical network for performing insulation measuring in a processing unit. The AC signal is measured in a mixed bridge having a first resistive dividing bridge connected in parallel with a second capacitive dividing bridge between the line and the ground. The intermediate output points of the first and second bridges are joined together and connected in an input of the processing unit. The impedance and the dividing ratio of the two bridges cause the DC voltage measured at said input to be low in relation to the value of the AC voltage measured at the output of said mixed bridge.

2 Claims, 1 Drawing Sheet

REFERENCE VOLTAGE MEASURING BRIDGE FOR A DEVICE FOR MONITORING AND MEASURING THE INSULATION OF A DC VOLTAGE ELECTRICAL MAINS SYSTEM

BACKGROUND OF THE INVENTION

The present invention relates to a reference voltage measuring bridge for a device for monitoring and measuring the insulation of a DC voltage electrical mains system, notably a low voltage system, for example about 600 volts, the voltage measuring bridge being designed to supply at least a portion of the useful input signal of an analysis channel of a reference AC voltage, of low frequency, comprised between 4 and 10 Hertz for example, and of low voltage, about 30 volts peak-to-peak for example, which is input to the DC electrical mains system.

It is state-of-the-art, for example from the documents FR-A-2,616,228 and FR-A-2,647,220, to use for monitoring and measuring the insulation of an electrical mains system with respect to earth, a device comprising an input circuit of a reference AC signal to the mains system to be monitored, and an electronic detection circuit able to supply a measurement signal representative of the insulation state of the mains system in response to sending of the reference signal, this insulation state being illustrated by a leakage impedance Zd formed by a leakage resistance Rf electrically connected in parallel to a stray capacitor Cf, whose capacity depends on the mains system characteristics.

The accompanying FIG. 1 represents the input circuit of the state-of-the-art insulation monitor in schematic form.

This involves in FIG. 1 a mains system supply DC voltage Vc of rather high amplitude, for example 600 volts. The voltage is applied between a line wire 1 and a return wire 2 which is insulated from the installation ground. The insulation impedance Zd between the two DC power supply wires 1 and 2 is composed of the leakage resistance Rf and the stray capacitor Cf, whose capacity depends on the mains system characteristics and which, as represented, is connected in parallel to the resistance Rf.

The insulation monitor, whose object is to monitor the two components Rf and Cf of the insulation impedance Zd, comprises means (not shown) for injecting a reference AC voltage Vd, via an input wire 4 and a coupling capacitor 3, between the line wire 1 and the installation ground. This AC voltage is of low frequency f, generally comprised between 4 and 10 Hertz, and has a relatively low peak-to-peak voltage, about thirty volts for example.

Determining the resistive value Rf and the capacitive value Cf of the impedance Zd requires both the value of the input voltage Vd and that of the corresponding current Id flowing in the insulation impedance Zd to be measured.

The current Id is measured by taking the value of the voltage at frequency f which is due to the current Id flowing in a measuring resistance R3 serially connected with the impedance Zd, between the return wire 2 and ground. The information is applied to an input E1 of the processing and display unit 5 which equips the insulation monitor.

The voltage Vd is measured, and applied to another input E2 of the unit 5, by taking it at the potentiometric output connector 6 of a dividing bridge with two resistances R1, R2, whose attenuation ratio, which is about 80 for example, and total resistance (R1=R2), which is about 600 kiloohms for example, are chosen in such a way as to achieve a compromise between:

the measuring precision which is greater the higher the ratio R2/R1 (high AC voltage input on the input E2) and the lower the resistance (R1+R2) of the bridge 7 (high alternating current flowing at this point);

the input impedance of the DC mains system which must not be reduced too much by the presence of this bridge 7;

the DC voltage level at the measuring point 6, which must not only be lower than the operating voltage of the semi-conducting components of the unit 5 (+15 volts, −15 volts in general), but which must also not be high with respect to that of the input AC voltage measured at the same point 6.

The solution described in the document FR-A-2,647,220 which consists in connecting a capacitor between the resistance R1 and the line conductor 1 gives rise to a stray phase displacement problem, liable to disturb the measuring precision.

Adopting a compromise of this kind in choosing the values of the resistances R1 and R2 cannot be totally satisfactory. The resulting impedance of the bridge 7 is in fact considered to be insufficient, and the useful AC signal taken at the mid-point 6 is so weak that it is practically drowned in the noise. The residual DC power supply at the mid-point 6 is much too high, both in voltage and current intensity values.

SUMMARY OF THE INVENTION

The object of the invention is to overcome these drawbacks. It relates for this purpose to a reference AC voltage measuring bridge for a device for monitoring and measuring the insulation of a DC voltage electrical mains system, the voltage measuring bridge being designed to supply at least a part of the useful input signal of the analysis channel of the reference AC voltage, which is input to the electrical mains system in order to be able to perform insulation measuring.

The measuring bridge is characterized in that it is achieved in the form of a mixed bridge formed by parallel connection, with joining, of the two respective potentiometric output points of a resistive dividing bridge of high total resistance and very low dividing ratio, and a capacitive dividing bridge having a high dividing ratio and a low impedance with respect to that of the lower of the two resistances of the resistive bridge at the frequency of the input reference signal, so that the value of the DC voltage measured at the output of the mixed bridge is low in relation to the value of the reference AC voltage measured on the same output, whereas the DC impedance of the bridge is high with respect to the input impedance of the DC mains system.

BRIEF DESCRIPTION OF THE DRAWINGS

The invention will be fully understood and its advantages and other features will become more clearly apparent from the following description of an illustrative embodiment of the invention, given as a non-restrictive example only and represented in the accompanying drawings, in which.

DESCRIPTION OF THE PREFERRED EMBODIMENT

Figure 1:
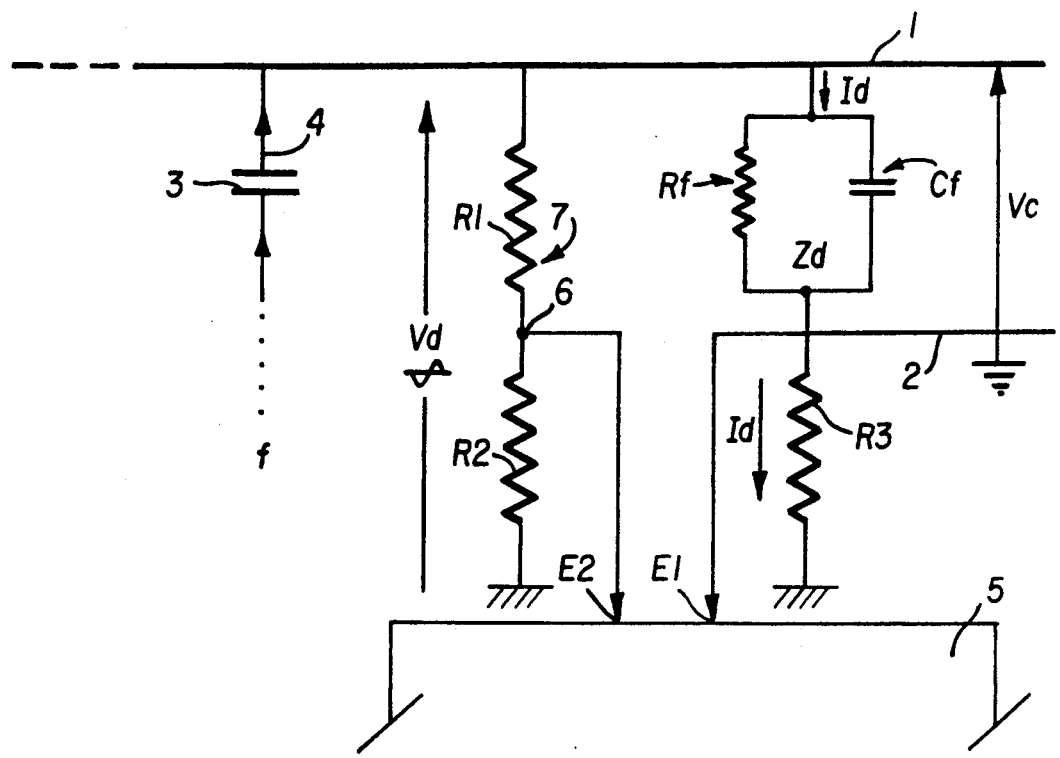
FIG. 1, already described above, illustrates a device according to the former art.
Figure 2:
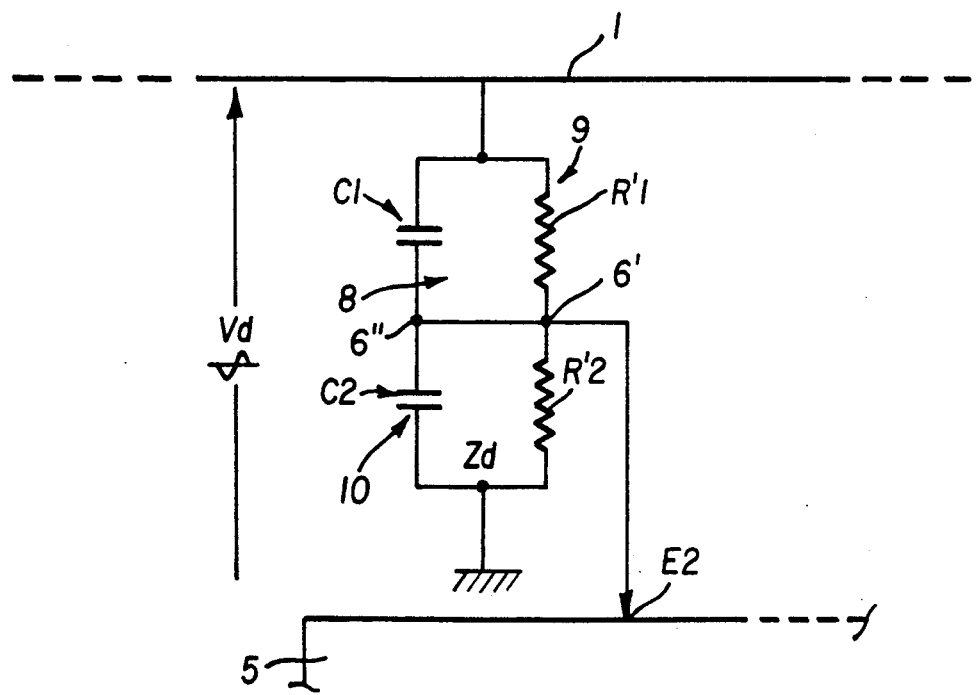
FIG. 2 is a measuring bridge according to the invention and which can be used in an insulation monitor input circuit similar to the one illustrated in FIG. 1.

FIG. 2 shows the line wire 1 of the DC electrical mains system, for example a 600 volt system, whose insulation impedance is to be determined, according to the manner of the device in FIG. 1, by means of the reference AC voltage Vd, for example with a frequency of 4 Hertz and a peak-to-peak amplitude of 30 volts, which is input to the DC mains system, and of the processing unit 5 whose input circuit comprises a device for measuring the current Id flowing in the insulation impedance Zd (see FIG. 1), and the device for measuring the reference voltage Vd which is the subject of the present invention, and which is therefore represented on its own in FIG. 2.

The device for measuring the voltage Vd here comprises a mixed bridge 8 which is formed by parallel connection with joining of the two respective potentiometric output points 6' and 6":

- of a resistive dividing bridge 9 which is made up, for example, of a resistance R'1 of about 100 Megaohms and of a resistance R'2 of about 100 kiloohms, so that the total impedance (R'1+R'2) of the bridge is very high with respect to the input impedance of the DC mains system, which is itself generally about 1 to 2 Megaohms, whereas the dividing ratio is very low, about one thousandth,
- of a capacitive dividing bridge 10 which is made up of two electrochemical capacitors C1 and C2 of high capacity, the latter being sufficient for the impedance of each of the capacitors C1 and C2, at the 4 Hertz frequency of the reference voltage Vd, to be very low with respect to that of the weaker, R'2, of the resistances of the resistive dividing bridge 9; the capacities are moreover chosen to give the bridge 10 a high dividing ratio. In the example, identical capacitors of 10 microfarads are used, so that their impedance is about 4 kiloohms at the 4 Hertz frequency (therefore negligible with respect to the resistance R'2 which has a value of 10 kiloohms) and the transformer ratio of the capacitive dividing bridge 10 is one half.

Operation of the measuring circuit 8 is as follows :

For the direct current present on the line wire 1, the capacitive bridge 10 does not have any influence, and, as the potentiometric dividing ratio of the resistive bridge 9 is one thousandth, the DC voltage input at the point E2 to the processing unit 5 is only 0.6 volts, therefore very low.

As far as the reference voltage at 4 Hertz frequency is concerned, the resistances, respectively R'1 and R'2, which are connected in parallel to the capacitors C1 and C2, are much too high to have an influence with respect to the capacitance of each of the capacitors, which is about 4 kiloohms. The AC voltage Vd therefore only "sees" the capacitive dividing bridge, whose total impedance is low and whose dividing ratio (one half) is high. The AC voltage input at the point E2 is therefore high, about 15 volts peak-to-peak, and is much higher than the previously mentioned value of 0.6 volts of the DC voltage input at the point E2, whereas the alternating current input is also high due to the low total impedance (about 8 kiloohms) of the bridge.

The invention is not limited to the embodiment particularly described herein, and any other kind of mixed bridge equivalent to the bridge 8 of FIG. 2 could be used in order to implement it.

We claim:

1. An insulation monitor for monitoring and measuring the insulation of a DC voltage electrical power system, said monitor comprising:

input circuit means for injecting a reference AC signal having a low frequency of about 4 to 10 Hz into a line of said power system;

an AC voltage measuring device comprising a mixed bridge including a resistive dividing bridge comprising a first resistance connected in series with a second resistance between the line of said power system and an installation ground, a capacitive dividing bridge including a first capacitor connected in series with a second capacitor between the line of said power system and said installation ground, wherein said resistive and capacitive dividing bridges are connected in parallel and have intermediate output points that are coupled together; and processing circuit means, having an input coupled to the intermediate output points of said resistive and capacitive dividing bridges, for performing a insulation measurement operation;

wherein the first resistive bridge has a total resistance which is very high with respect to the input impedance of said power system, and a dividing ratio of about one thousandth; the second capacitive bridge has a dividing ratio of about one half, and a low impedance with respect to that of the lower of the first and second resistances of the resistive bridge, at the frequency of the reference AC signal, so that a value of a DC voltage measured at said intermediate output points is low in relation to the value of the reference AC voltage measured on the same output points; and the DC impedance of said mixed bridge is high with respect to the input impedance of said power system.

2. An insulation monitor as claimed in claim 1, wherein the total resistance of said resistive dividing bridge is about one hundred Megaohms and each capacitor of said capacitive bridge has a capacitance of about ten microfarads.

* * * * *